United States Patent [19]

Adair et al.

[11] Patent Number: 4,576,891

[45] Date of Patent: Mar. 18, 1986

[54] PHOTOSENSITIVE MICROCAPSULES USEFUL IN POLYCHROMATIC IMAGING HAVING RADIATION ABSORBER

[75] Inventors: Paul C. Adair; Amy L. Burkholder, both of Chillicothe, Ohio

[73] Assignee: The Mead Corporation, Dayton, Ohio

[21] Appl. No.: 620,994

[22] Filed: Jun. 15, 1984

[51] Int. Cl.[4] .......................... S03C 1/00; B01J 13/02
[52] U.S. Cl. .................................. 430/138; 252/600; 427/213.31; 428/402.2; 428/402.21; 428/402.24; 430/512; 430/926
[58] Field of Search ...................... 430/138, 926, 512; 252/600; 427/213.31; 428/402.2, 402.21, 404.24; 438/138

[56] References Cited

U.S. PATENT DOCUMENTS

| | | | |
|---|---|---|---|
| 3,060,029 | 10/1962 | Cerwonka | |
| 3,485,764 | 12/1969 | Kazan | 252/600 X |
| 4,069,168 | 1/1978 | Leatherman et al. | 252/600 X |
| 4,293,634 | 10/1981 | Monosov | 430/138 X |
| 4,360,558 | 11/1982 | Postle | 430/512 |
| 4,362,809 | 12/1982 | Chen et al. | 430/138 |
| 4,399,209 | 8/1983 | Sanders et al. | 430/138 |
| 4,440,846 | 4/1984 | Sanders et al. | 430/138 |

Primary Examiner—John E. Kittle
Assistant Examiner—Mukund J. Shah
Attorney, Agent, or Firm—Biebel, French & Nauman

[57] ABSTRACT

Photosensitive microcapsules having radiation absorbers associated therewith such that the sensitivity of the microcapsules is reduced over a portion of their spectral sensitivity range; the spectral sensitivity of the microcapsules is thereby adjusted such that three sets of microcapsules having distinctly different spectral sensitivities and individually containing color formers for full color imaging can be provided on a single support surface and discriminately exposed in a manner which corresponds to the red, green and blue components of an original.

12 Claims, 5 Drawing Figures

PHOTOSENSITIVE MICROCAPSULES USEFUL IN POLYCHROMATIC IMAGING HAVING RADIATION ABSORBER

BACKGROUND OF THE INVENTION

The present invention relates to photosensitive microcapsules which are useful in forming polychromatic or full color images using the imaging processes described in U.S. Pat. Nos. 4,399,209 and 4,440,846 to The Mead Corporation. More particularly, the present invention relates to photosensitive microcapsules containing a photosensitive composition in which a radiation absorber is associated with the microcapsules. The radiation absorber reduces the sensitivity of the microcapsules at certain wavelengths such that a set of microcapsules containing the color formers necessary for full color imaging can be designed in which the microcapsules have sufficiently distinct spectral sensitivities that they can be discriminately hardened using exposures at distinctly different radiation wavelengths.

U.S. patent application Ser. No. 339,917 filed Jan. 18, 1982, by The Mead Corporation describes a photosensitive material useful in full color imaging comprising a support having on the surface thereof microcapsules which individually contain cyan, magenta and yellow color formers and photosensitive compositions having distinctly different sensitivities. A uniform mixture of the microcapsules is distributed over the surface of the support. Images are formed by separating the red, green and blue components of the image to be reproduced and translating these components into different wavelengths of actinic radiation to which the photosensitive compositions are distinctly sensitive. The photosensitive material is image-wise exposed to the translated radiation and thereafter it is subjected to a uniform rupturing force, such as pressure, which causes the microcapsules in the underexposed and unexposed areas to rupture and release the color formers. The color formers then react with a developer material which is contained on the same or a different support and produce a full color image.

The spectral sensitivity of photosensitive microcapsules is principally a function of the photoinitiator used in the encapsulated photosensitive composition. In order to design photosensitive microcapsules useful in full color imaging having distinctly different spectral sensitivities, photoinitiators must be designed or selected which have mutually exclusive sensitivities in at least three distinct wavelength regions. That is, the photoinitiator used in microcapsules containing a cyan color former must be substantially more sensitive in a wavelength region in which the photoinitiators used in the microcapsules associated with the magenta and yellow color formers are substantially less sensitive or insensitive. Likewise, the photoinitiator used in the microcapsules containing the cyan color former must be substantially less sensitive and ideally insensitive in a wavelength region in which the photoinitiators used in the microcapsules containing the magenta and yellow color formers are preferentially sensitive. The same considerations govern the selection of the initiators associated with the microcapsules containing the yellow and magenta color formers.

The selection and/or design of microcapsules having mutually exclusive sensitivity characteristics as described above is simplified by associating a radiation absorber with the microcapsules in accordance with the present invention.

SUMMARY OF THE INVENTION

In accordance with the present invention, photosensitive microcapsules having sufficiently different spectral sensitivities to be useful in full color imaging are obtained by associating a radiation absorber with the microcapsules such that the sensitivity of the microcapsules is reduced over a portion of their spectral sensitivity range.

In accordance with the present invention, microcapsules useful in forming polychromatic images are obtained by coordinating the selection of the photoinitiators used in the photosensitive compositions with the selection of the absorber such that the absorber "shields" the microcapsules from exposures intended for other microcapsules in the polychromatic system. For example, an absorber is selected for use with the cyan forming microcapsules which prevents those microcapsules from being exposed by exposures within the sensitivity range of the magenta forming capsules. In this manner, the spectral sensitivity of the microcapsules can be more narrowly defined, there is greater exposure latitude and there is greater latitude in the selection of the other photoinitiators used in the system.

Accordingly, one embodiment of the present invention resides in a photosensitive microcapsule containing a photosensitive composition which hardens upon exposure to actinic radiation, wherein a radiation absorber is associated with the microcapsule such that the sensitivity of the microcapsule is reduced over a portion of its spectral sensitivity range. The absorber can be present in the photosensitive composition itself, in the wall of a microcapsule having a discrete wall, in the binder forming the continuous phase of an open phase microcapsule, or in a binder in which microcapsules having discrete walls are dispersed. Preferably, the absorber is present in the photosensitive composition or in the capsule wall.

Another embodiment of the present invention resides in a photosensitive material comprising a support having a layer containing the aforementioned microcapsules on the surface thereof.

Another embodiment of the present invention resides in a photosensitive material useful in full color imaging which comprises a support having on the surface thereof microcapsules containing a cyan color former and a first photohardenable composition, microcapsules containing a magenta color former and a second photohardenable composition, and microcapsules containing a yellow color former and a third photohardenable composition, at least one of the aforesaid microcapsules having associated therewith an absorber which reduces the sensitivity of the photohardenable composition encapsulated therein over a portion of its spectral sensitivity range such that the microcapsules have sufficiently different sensitivity characteristics that the first photohardenable composition can be hardened upon exposure of the microcapsule to actinic radiation of a first wavelength without substantially hardening the encapsulated second and third photohardenable compositions, the second photohardenable composition can be hardened upon exposure of the microcapsule to actinic radiation of a second wavelength without substantially hardening the encapsulated first and third photohardenable compositions, and the third photohardenable composition can be hardened upon exposure of the microcapsule to actinic radiation of a third wavelength without substantially hardening the encapsulated first and second photohardenable compositions.

DEFINITIONS

The term "microcapsule" as used herein includes both microcapsules having a discrete capsule wall and so-called open phase microcapsules formed by dispersing a solution of the photosensitive composition and the color former in an appropriate binder.

The term "spectral sensitivity range" as used herein refers to the spectral regions in which a photosensitive composition or microcapsule responds to radiation.

The term "harden" as used herein means to increase the viscosity or hardness of the internal phase and is not limited strictly to solidification.

BRIEF DESCRIPTION OF THE DRAWINGS

The present invention will be explained in more detail by reference to the accompanying drawings wherein.

DETAILED DESCRIPTION OF THE INVENTION

U.S. application Ser. No. 339,917, filed Jan. 18, 1982, is incorporated herein by reference.

Figure 1:
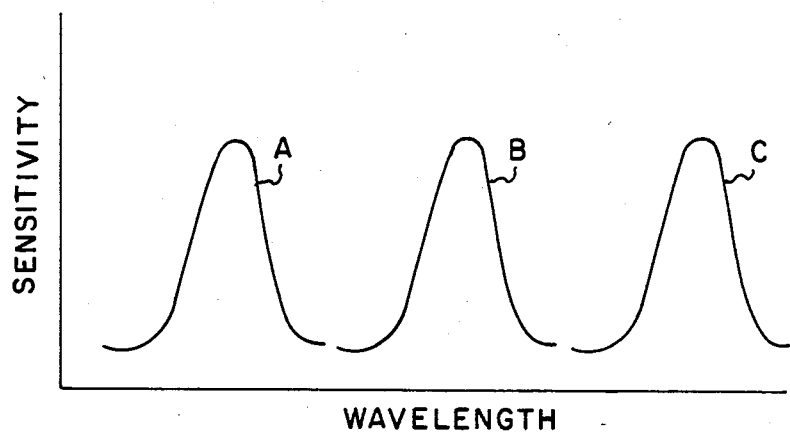
FIG. 1 is a graph of the spectral sensitivity curves for a set of microcapsules useful in full color imaging.

FIG. 1 contains the spectral sensitivity curves for a set of three microcapsules (A, B, and C) the spectral sensitivities of which are optimally suited for use in full color imaging. Capsule A is sensitive in a first range, Capsule B is sensitive in a second range, and Capsule C is sensitive in a third range and none of Capsules A, B and C are substantially sensitive in the ranges in which the other capsules are sensitive. Because there is often significant overlap in the spectral sensitivities of initiators, it is difficult to achieve the relationship shown in FIG. 1.

Figure 2:
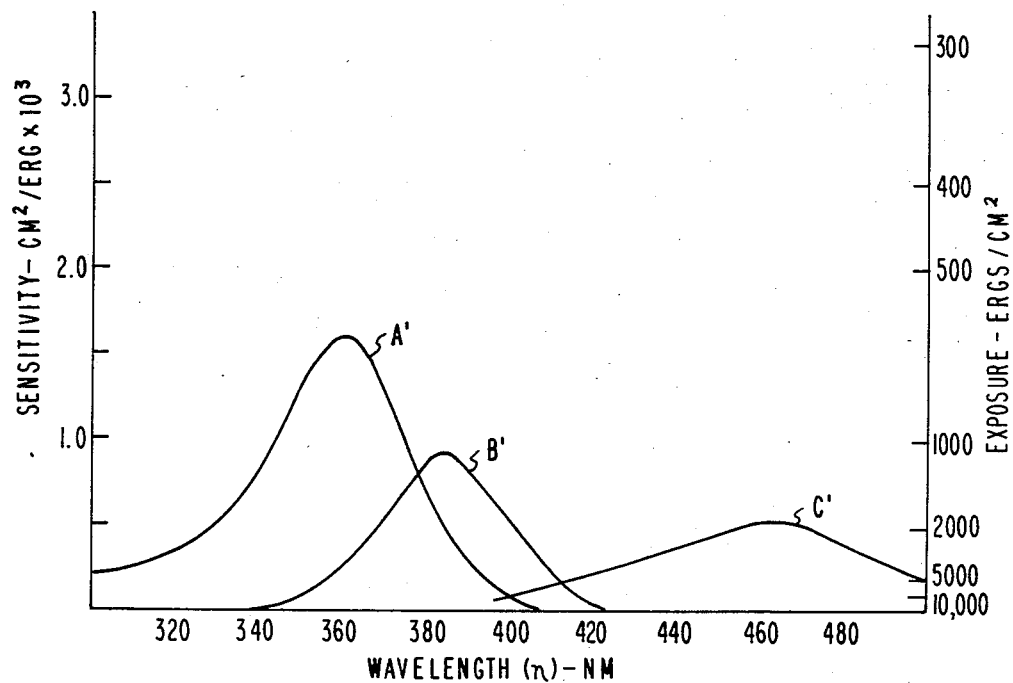
FIG. 2 is a graph of the spectral sensitivity curves of the microcapsules described in Example 4.

FIG. 2 is a plot of the spectral sensitivity curves for the microcapsules A', B', and C' of Example 4 below. As can be seen from FIG. 2, the spectral sensitivities of the microcapsules are not perfectly exclusive, but there are distinct wavelength bands in which each group of capsules can be exposed without substantially exposing the others. The spectral sensitivity curve of Capsule B' overlaps with that of Capsule A', however, by exposing Capsule A' with UV radiation in the range of 340-360 nm and limiting the intensity, Capsule A' can be exposed without substantially exposing Capsule B'. Similarly, although the spectral sensitivity of Capsule A' overlaps that of Capsule B', by exposing at 390-400 nm and limiting intensity, Capsule B' can be exposed without substantially exposing Capsule A' or C'. The exposure of Capsule C' can be carried out with much more latitude since at longer wavelengths its spectral sensitivity curve does not substantially overlap the others. Accordingly, microcapsules useful in forming full color images can be obtained by individually incorporating cyan, magenta and yellow color formers in the microcapsules of FIG. 2.

The present invention is useful in tailoring the sensitivities of microcapsules throughout the electromagnetic spectrum, but it is particularly useful in narrowing the sensitivity of microcapsules to ultraviolet radiation.

Figure 3:
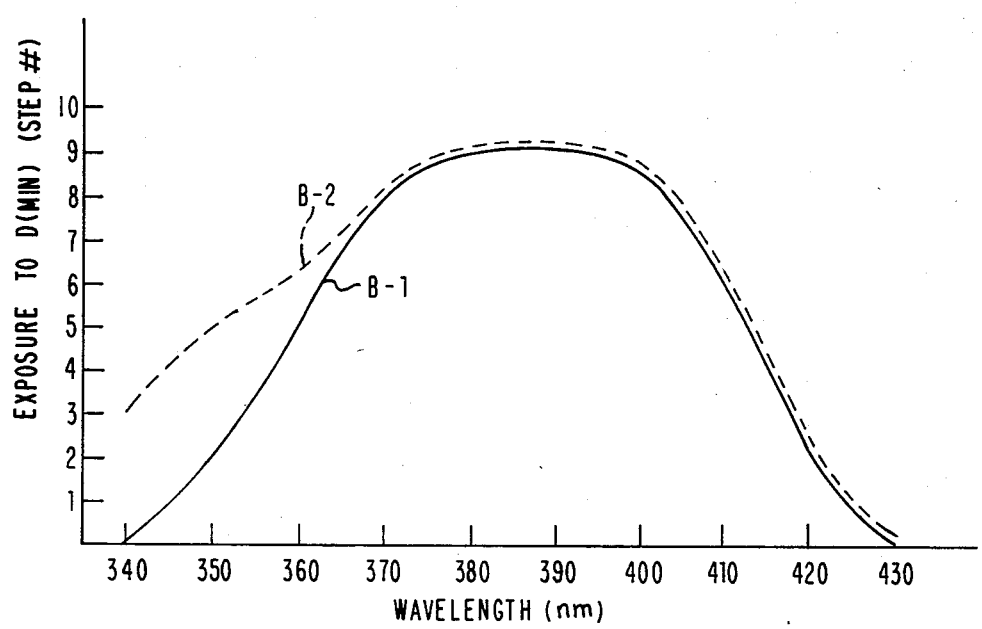
FIG. 3 is a graph of the spectral sensitivity of a microcapsule containing an absorber compound and the same microcapsule without the absorber (Example 2).

The function of the absorber in tailoring the sensitivity of microcapsules is illustrated in FIG. 3 wherein the spectral sensitivity curve (Curve B-1) corresponds to Curve B' in FIG. 2 and is shown in comparison to the spectral sensitivity curve for the same microcapsule without the ultraviolet absorber present (Curve B-2). The photosensitive composition encapsulated in these microcapsules contains 2-isopropylthioxanthone and ethyl-4-dimethylaminobenzoate as initiators. As can be seen from Curve B-2, this photoinitiator system is quite sensitive at 350 nm as well as at 390 nm. The present invention addresses the problem of decreasing the sensitivity of the system at 350 nm where photosensitivity is not desired.

It can be seen from a comparison of Curves B-1 and B-2 that the UV absorber reduces the sensitivity of the microcapsules in the range of 340–360 nm. In this manner, the absorber provides greater latitude in the exposure that may be used to expose Capsule A' in FIG. 2. As Curve B-1 demonstrates, without the UV absorber, Capsule B' would be much more sensitive in the range of 340–360 nm, making it more difficult to select an exposure wavelength for Capsule A' and limit the intensity so as to expose Capsule A' without exposing Capsule B'.

Figure 4:
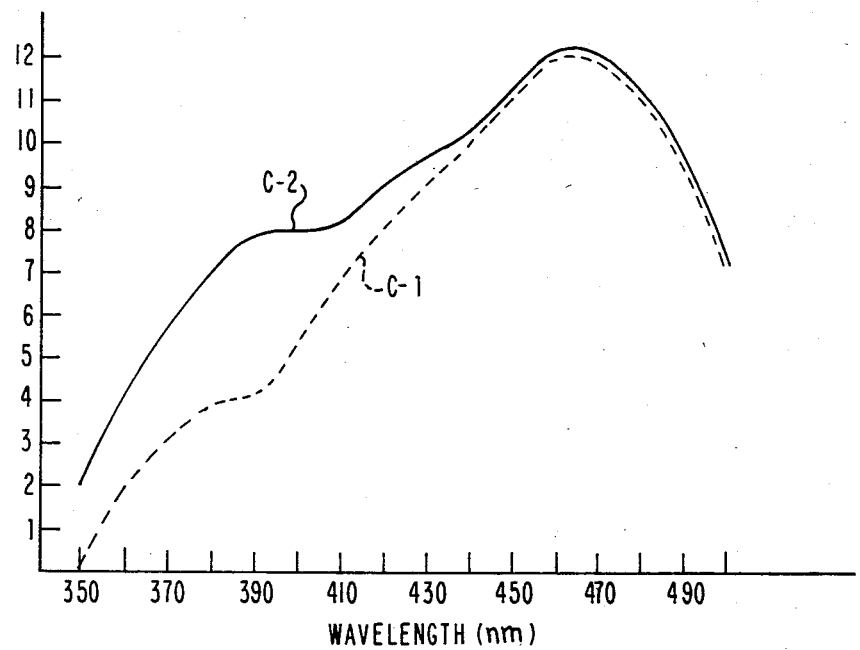
FIG. 4 is a graph similar to FIG. 3 for a microcapsule containing a different photoinitiator (Example 3).

The effect of the absorber is further illustrated in FIG. 4 for Capsule C' where Curve C-1 is the spectral sensitivity Curve in FIG. 2 and Curve C-2 is the sensitivity curve for the same microcapsule without the UV absorber. The initiator used in these microcapsules, 7-diethylamino-3-cinnamoylcoumarin (U.S. Pat. No. 4,147,552) and ethyl-4-dimethylaminobenzoate, is highly sensitive at 470 nm and also imparts significant sensitivity at shorter wavelengths. By narrowing the sensitivity of Capsule C', Capsule B' can be exposed at higher wavelengths with less likelihood of exposing Capsule A'.

Hereinbelow, the considerations which govern the selection of the absorber are summarized.

An absorber should be selected which reduces the sensitivity of the microcapsule in those portions of its spectral sensitivity range which interfere with the exposure of microcapsules at other wavelengths (its inactive range) without overly reducing the sensitivity of the microcapsule in those portions of the spectral sensitivity range in which the microcapsule is intended to be exposed (its active range). In some cases it may be necessary to balance the absorption characteristics of the absorber in the active range and the inactive range to achieve optimum exposure characteristics. Generally absorbers having an extinction coefficient greater than about 100/M cm in the inactive range and less than about 100,000/M cm in the active range of the microcapsule are preferred. When the absorber is directly incorporated into the photosensitive composition, ideally, it should not inhibit free radical polymerization, and it should not generate free radicals upon exposure.

The absorbers used in the present invention can be selected from among those absorbers which are known in the photographic art. Examples of such compounds include dyes conventionally used as silver halide sensitizing dyes in color photography (e.g., cyanine, merocyanine, hemicyanine and styryl dyes) and ultraviolet absorbers. A number of colored dyes which absorb outside the desired sensitivity range of the microcapsules and do not absorb heavily within the range could also be used as absorbers in the present invention. Among these, Sudan I, Sudan II, Sudan III, Sudan Orange G, Oil Red O, Oil Blue N, and Fast Garnet GBC are examples of potentially useful compounds.

Ultraviolet absorbers that are useful in the present invention are selected from hydroxybenzophenones, hydroxyphenylbenzo-triazoles and formamidines. The absorbers may be used alone or in combination to achieve the spectral sensitivity characteristics that are desired.

Representative examples of useful hydroxybenzophenones are 2-hydroxy-4-n-octoxybenzophenone (UV-CHEK AM-300 from Ferro Chemical Division, Mark 1413 from Argus Chemical Division, Witco Chem. Corp., and Cyasorb UV-531 Light Absorber from American Cyanamid), 4-dodecyl-2-hydroxybenzophenone (Eastman Inhibitor DOBP from Eastman Kodak), 2-hydroxy-4-methoxybenzophenone (Cyasorb UV-9 Light Absorber from American Cyanamid), and 2,2'-dihydroxy-4-methoxybenzophenone (Cyasorb UV-24 Light Absorber from American Cyanamid). Representative examples of useful hydroxybenzophenyl benzotriazoles are 2-(2'-hydroxy-5'-methylphenyl)benzotriazole (Tinuvin P from Ciba-Geigy Additives Dept.), 2-(3',5'-ditert-butyl-2'hydroxyphenyl)-5-chlorobenzotriazole (Tinuvin 327 from Ciba-Geigy), and 2-(2-hydroxy-5-t-octylphenyl)benzotriazole (Cyasorb UV-5411 Light Absorber from American Cyanamid). Representative examples of useful formamidines are described in U.S. Pat. No. 4,021,471 and include N-(p-ethoxy-carbonylphenyl)-N'-ethyl-N'-phenylformamidine (Givsorb UV-2 from Givaudan Corp.). The optimum absorber and concentration of absorber for a particular application depends on both the absorption maximum and extinction coefficient of the absorber candidates and the spectral sensitivity characteristics of the associated photoinitiators.

With the exception of the incorporation of an ultraviolet absorber, the microcapsules, photosensitive compositions, image-forming agents, developers, and development techniques described in U.S. Pat. Nos. 4,399,209 and 4,440,846 can be used in the present invention.

The mechanism by which images are formed using encapsulated photosensitive compositions is described in U.S. Pat. Nos. 4,399,209 and 4,440,846. Summarizing, exposure produces an increase in the viscosity of the internal phase in the microcapsules which controls the amount of color former which is released from the capsules and is reacted with the developer. This increase in viscosity prevents a fully exposed capsule from rupturing and releasing the internal phase. The imaging mechanism is unclear in that the fully exposed capsule either does not rupture or it ruptures but does not release the internal phase. In the unexposed and underexposed areas, the capsules rupture and release the internal phase and the amount of the internal phase released is a function of the degree of exposure. Tonal characteristics can be achieved when desired. Again, the imaging mechanism is not clear. All the capsules may rupture or because the size of the capsules varies the number of capsules which rupture may be a function of the degree of exposure.

In addition to pressure, the capsules can be ruptured by other means including by peeling development, thermal development, solvent vapor, ultrasonic energy or the like. A gas generating agent can be incorporated in the capsules so that they can be ruptured by heating.

Known photohardenable compositions can be used in the present invention. The compositions which are most useful are those which are curable by free radical initiation, addition polymerization or crosslinking. The most common examples of such compositions are compositions which contain an ethylenically unsaturated compound, e.g., a compound containing terminal or pendant vinyl or allvlic groups. Such compounds are well known in the art and include acrylic and methacrylic esters of polyhydric alcohols such as trimethylolpropane, pentaerythritol, and the like. Representative examples include ethylene glycol diacrylate, ethylene glycol dimethacrylate, trimethylolpropane triacrylate (TMPTA), pentaerythritol tetraacrylate, pentaerythritol tetramethacrylate, hexanediol-1,6-dimethylacrylate, and diethyleneglycol dimethacrylate.

Photoinitiators are selected based on their spectral sensitivities such that there is minimum overlap in their spectral sensitivities and the microcapsules have adequate sensitivity in their respective active ranges. As a general rule, the photosensitive composition containing the photoinitiator should provide a microcapsule having a sensitivity (E) less than 10,000 ergs/cm$^2$ in the desired exposure range. The term "sensitivity" corresponds to the amount of incident radiation required to produce a first loss in density of 0.10 density units. The photosensitive microcapsules of the present invention are by nature positive working. Consequently, when unexposed the microcapsules rupture and activate the color former which reacts with the developer to produce a maximum image density. Thus, the term "sensitivity" represents the minimum exposure necessary to effect a substantive reduction (0.10 density units) in that maximum density.

Useful initiators include photoinitiators which generate free radicals upon photochemical cleavage (homolytic initiators) such as certain benzoin ethers and initiators which function via hydrogen abstraction. Preferred initiators are soluble in the radiation sensitive composition. Xanthones, thioxanthones, polycyclic quinones, acetophenones, b 3-substituted coumarins, diaryl ketones, diaryl diketones, and benzoin alkyl ethers are particularly useful. Specific examples of useful initiators are benzophenone, Michler's ketone, benzoin methyl ether, 2,2-dimethoxy-2-phenylacetophenone, isopropylthioxanthone, ethyl para-dimethylaminobenzoate, 3-cinnamoyl-7-diethylamino coumarins, etc.

To provide a color system which is visible lightsensitive, a potentially useful red initiator is N,N,N',N'-tetra-n-butylthionine; a potentially useful green initiator is N,N,N',N'-tetramethyl-4'-dodecylsafranine, and a potential blue initiator is phenanthraquinone. Another initiator system useful in a red or green light-sensitive microcapsule is described in U.S. Pat. No. 3,495,987.

The photoinitiator is present in the photosensitive composition in an amount sufficient to initiate polymerization or crosslinking within a suitable exposure time. For example, benzoin methyl ether is typically present in an amount up to about 10% by weight based on the weight of the photocrosslinkable or photopolymerizable species. The exact amount of photoinitiator used will vary with the nature of the photosensitive composition.

In accordance with one embodiment of the present invention, the radiation sensitive composition may additionally include a polythiol to increase the film speed of the microcapsules.

Useful polythiols include ethylene glycol bis(thioglycolate), ethylene glycol bis(β-mercaptopropionate), trimethylolpropane tris(thioglycolate), pentaerythritol tetrakis(thioglycolate) and the most preferred pentaerythritol tetrakis(β-mercaptopropionate) and trimethylolpropane tris(β-mercaptopropionate), and mixtures thereof. These compounds are commercially available. Certain polymeric polythiols such as polypropylene ether glycol bis(β-mercaptopropionate) which is prepared by esterification of polypropylene ether glycol may also be useful.

Various oligomers or polymers can also be used in the present invention to improve the film speed of the microcapsules. These materials increase the rate with which the viscosity of the internal phase of the microcapsules builds to a level at which differential release of the internal phase is achieved. These materials must be soluble in the photosensitive composition and not interfere with the photopolymerization reaction. Reactive oligomers contain terminal or pendant ethylenic unsaturation and include urethane, ester and epoxy based reactive acrylate, methacrylate, vinyl and allyl prepolymers. Useful non-reactive oligomers or polymers are solid or viscous liquids at room temperature but soluble in the unreacted photosensitive composition. Representative examples of some commercially available oligomers or polymers which are useful in the present invention include reactive materials such as diallyl o-phthalate prepolymer (Polysciences), UVithane 893 (Morton Thiokol, Inc.), Ebercryl 270 (Virginia Chemicals) and non-reactive materials such as ethyl cellulose, or Lucite.

The color former may be associated with the microcapsules in various ways such that upon rupturing the microcapsule and releasing of the internal phase, the color former is able to react and/or migrate to the developer and produce an image. For example, the color former may be encapsulated with the photosensitive composition or incorporated in the wall of a microcapsule having a discrete wall. In the latter case, the photosensitive composition released from the capsules dissolves the color former and transports it to the developer.

One example of a useful color former in the invention is a colorless electron donating compound. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like.

Cyan, magenta and yellow color precursors useful in the present invention can be selected from commercially available materials. Reakt Yellow (186) (a product of BASF), Copikem XI and Copikem XIV (products of Hilton-Davis Chemical Co.) are useful yellow color formers; Cyan S-29663 (an experimental compound from Hilton Davis), Copikem X (a product of Hilton-Davis) and color formers described in U.S. Pat. No. 4,322,352 are useful cyan color formers and Copikem XX (a product of Hilton Davis) and Pergascript Red (Ciba-Geigy) are useful as magenta color formers. Other examples of useful color formers are shown below:

Yellow color precursors:

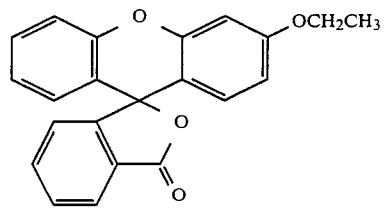

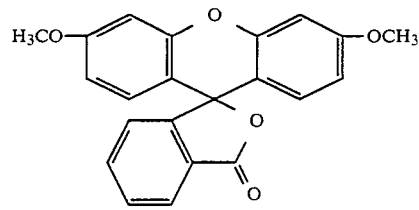

Cyan color precursors:

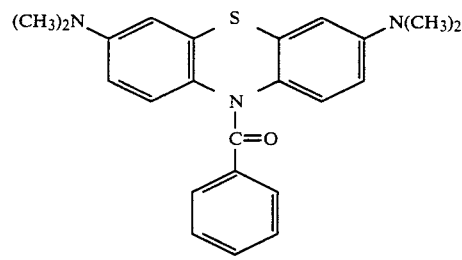

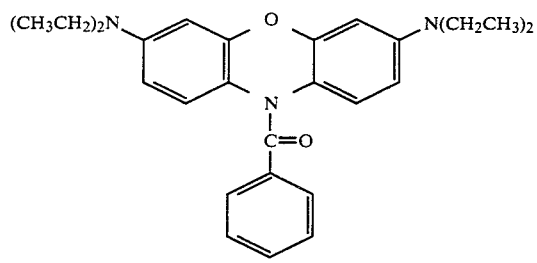

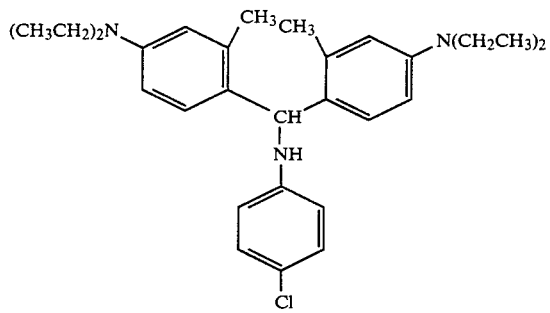

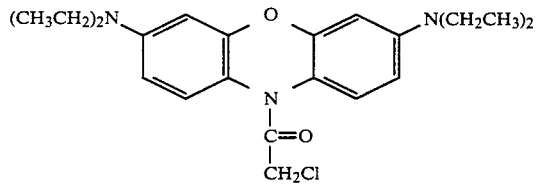

Magenta color precursors:

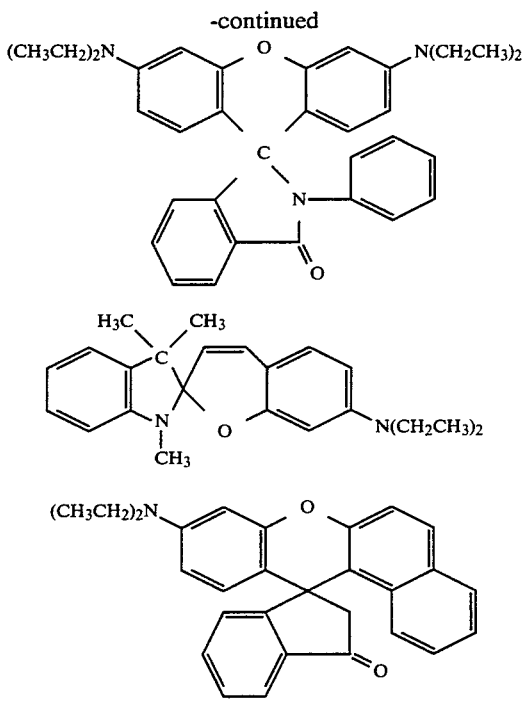

The color former is incorporated in the internal phase in an amount sufficient to produce a visible image of the desired density upon reaction with a developer or upon transfer. In general, the image former is present in an amount of approximately 0.5 to 20% by weight based on the weight of the internal phase. A preferred range is about 2 to 10% by weight. Transfer imaging materials usually contain about 6% by weight of the color former whereas self-contained materials contain about 1.5 to 3% by weight of the image-forming agent. The relative amounts of the cyan, magenta and yellow color formers in the microcapsules are adjusted to provide satisfactory color balance. In conjunction with this, the relative amounts of the microcapsules in the coating composition can be adjusted to improve color balance.

In addition to the photosensitive composition, the internal phase may additionally include a diluent oil. Inclusion of the oil often improves half tone gradation in visual images. Preferred diluent oils are weakly polar solvents having boiling points above 170° C. and preferably in the range of 180° to 300° C. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls and kerosene are generally less toxic and preferred. The amount of diluent oil incorporated in the microcapsules will depend upon the photographic characteristics that are dedsired in the photosensitive materials. Typically, the diluent oil is used in an amount of approximately 10 to 20% by weight based on the weight of the internal phase.

The photosensitive microcapsules of the present invention can be formed using known encapsulation techniques. The photosensitive composition and associated agents can be encapsulated in hydrophilic wall-forming materials such as gelatin-type materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle). Urea-formaldehyde microcapsules are preferred for use in the present invention. Methods for producing urea formaldehyde capsules which are particularly useful are described in U.S. Pat. Nos. 4,251,386 and 4,138,362.

The mean size of the microcapsules of the present invention generally ranges from approximately 1 to 25 microns. As a general rule, image resolution improves as capsule size decreases except that if the capsule size is too small, the capsules may disappear in the pore or fiber structure of some substrates.

The microcapsules of the present invention can be used to form either transfer or self-contained imaging systems, i.e., systems in which the developer is on the same or a separate support from the microcapsules. A detailed description of transfer materials can be found in U.S. Pat. No. 4,399,209. Self contained systems are the subject of commonly assigned U.S. Pat. No. 4,440,846.

Illustrative examples of color developers useful with the electron donating type color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert-butyl salicylate, zinc 3-cyclohexyl-5-($\alpha$,$\alpha$-dimethylbenzyl)salicylate (see U.S. Pat. Nos. 3,864,146 and 3,934,070), oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

The most common substrate for the photosensitive material of this invention is paper. The paper may be a commercial impact raw stock, or a special grade paper such as cast-coated paper or chrome-rolled paper. Transparent substrate such as polyethylene terephthalate and translucent substrates can also be used in this invention.

Photosensitive materials are typically prepared by forming a slurry of the photosensitive microcapsules and coating this slurry on the surface of the appropriate substrate using conventional coating techniques. The coating compositions may additionally contain additives to improve the handling characteristics of the material. Typical examples of such additives are a stilt material such as starch particles and silica particles which prevent specking when the photosensitive material is passed through the nip between two pressure rollers.

In coating the microcapsules on the support, it is generally desirable to pre-mix the cyan, magenta and yellow forming capsules rather than to use sequential coating techniques. If the capsules are sequentially coated, a coating sequence should be adopted that assures that the absorber in one capsule does not shield the photosensitive composition in another capsule. The reason for this is that absorbers are selected such that they are active (in terms of absorptivity) in the wavelength regions in which other microcapsules are designed to be sensitive. Hence, unless this precaution is taken using sequential coating, one group of capsules could detrimentally shield another group of capsules from exposure.

Where the microcapsules are respectively sensitive to red, green and blue light, the exposure apparatus requires only a light source, means of focusing the light source from the original onto the imaging sheet, means to join the imaging sheet with the developer sheet (in the case of a transfer material), and means for rupturing the microcapsules. Simplified means such as this can be used with the invention because development is essentially a dry process with the internal phase and the developer interacting in only infinitesimal droplets.

When the microcapsules are not sensitive to visible light, it is necessary to include means for separating the red, green and blue components of the original and translating them into three distinct bands of actinic radiation. Any of the conventional means for electronically processing a visible image may be used for this purpose including a Dunn camera or a matrix camera. Generally, conventional means for accomplishing image translation include color filters to resolve the original into its component images, photoreceptors for sensing the respective component images, means for scanning those photoreceptors and generating an electrical output, and imaging tubes for converting the output to an appropriate radiation wavelength. In accordance with one exposure device, red, green and blue signals are separated in a color terminal and sent to a Dunn camera. Black and white signals are then sequentially generated on the Dunn CRT screen corresponding to the color signals. Three separate exposures are used through three filters each of which provides a distinct band of actinic radaion to which the cyan, magenta and yellow producing microcapsules are respectively sensitive. Alternatively, an exposure device could be constructed which includes three CRT tubes, each of which has a different output wavelength.

The present invention is illustrated in more detail by the following non-limiting Examples wherein the following procedures were used to prepare the microcapsules and the developer sheet.

CAPSULE PREPARATION

1. Into a 1200 ml stainless steel beaker, 416 g water and 99.2 g isobutylene maleic anhydride copolymer (18%) are weighed.
2. The beaker is clamped in place on a hot plate under an overhead mixer. A six-bladed, 45° pitch, turbine impeller is used on the mixer.
3. After thoroughly mixing, 12.4 g pectin (polygalacturonic acid methyl ester) is slowly sifted into the beaker. This mixture is stirred for 20 minutes.
4. The pH is adjusted to 4.0 using a 20% solution of $H_2SO_4$, and 0.4 g Quadrol (2-hydroxypropyl ethylenediamine with propylene oxide from BASF) is added.
5. The mixer is turned up to 3000 rpm and the internal phase is added over a period of 10–15 seconds. Emulsification is continued for 10 minutes.
6. At the start of emulsification, the hot plate is turned up so heating continues during emulsification.
7. After 10 minutes, the mixing speed is reduced to 2000 rpm and 66.4 g urea solution (50% w/w), 3.2 g resorcinol in 20 g water, 85.6 g formaldehyde (37%), and 2.4 g ammonium sulfate in 40 ml water are added at two-minute intervals.
8. The beaker is covered with foil and a heat gun is used to help bring the temperature of the preparation to 65° C. When 65° C. is reached, the hot plate is adjusted to maintain this temperature for a two to three hour cure time during which the capsule walls are formed.
9. After curing, the heat is turned off and the pH is adjusted to 9.0 using a 20% NaOH solution.
10. Dry sodium bisulfite (11.2 g) is added and the capsule preparation is cooled to room temperature.

DEVELOPER SHEET PREPARATION

A mixture of 852 g water, 250 g 25% Tamol 731 (Rohm & Haas Chemical Co.), 75 g HT clay, 1000 g KC-11 (a synthetic developer manufactured by Fuji Photo Film Company, Ltd.), 15 g Calgon T (Calgon, Inc.) 30 g Dequest 2006 (Monsanto Co.) was ground to a particle size less than 5 microns. To this mixture was added 25 parts HT clay and 10 parts Dow 501 latex per 65 parts of the mixture. The resultant material was coated with a #10 Meyer bar on 80 lb Black and White Enamel base stock at 30 to 35% solids.

EXAMPLE 1

An initiator useful in imparting blue-light sensitivity to capsules is 7-diethylamino-3-cinnamoylcoumarin (U.S. Pat. No. 4,147,552, Specht and Farid). Although highly sensitive at 470 nm, this compound also imparts a significant sensitivity to the capsules at shorter wavelengths. This shorter wavelength sensitivity is a problem which can be dealt with by the inclusion of a UV absorber.

A series of capsule batches with different absorbers was produced (as described above) which contained the following internal phase:

| | |
|---|---|
| TMPTA (trimethylol propane triacrylate) | 200 g |
| 7-diethylamino-3-cinnamoylcoumarin | 0.4 g |
| Quanticure EPD (Ward-Blenkinsop, Ltd.) | 8 g |
| Reakt Yellow (BASF) | 20 g |
| Absorber | 4 g |

Each of the resultant capsule emulsions was diluted 1:1 by weight with water containing 0.5% Triton X-100 surfactant (Rohm and Haas) and coated onto 80 lb. Black and White glossy paper (Mead Corp.) with a No. 12 wire-wound rod. After drying, capsule sheets were exposed with a Kratos 1000W monochrometer system at 350, 390, and 470 nm (20 nm bandpass) through a $\sqrt{2}$ step wedge (VWR). The geometry of the system and exposure times were such that the exposure was 10,000 ergs/cm² at 350 nm, 13,000 ergs/cm² at 390 nm, and 23,500 ergs/cm² at 470 nm. Every two steps down the step tablet resulted in a decrease in exposure by a factor of two. Thus, the larger the number in the below table, the less energy is required for a given response.

| | First Loss of Density (Step #) | | Exposure to Dmin (Step #) |
|---|---|---|---|
| | 350 nm | 390 mn | 470 nm |
| None | 2.5 | 6 | 6 |
| Tinuvin 327 | 0 | 4 | 6 |
| Tinuvin P | 0 | 5 | 6 |
| Tinuvin 328 | 0 | 5 | 6 |
| Givsorb UV-2 | 0 | 6 | 6 |
| Tinuvin 326 | 0 | 1 | 5 |

|                | First Loss of Density (Step #) | | Exposure to Dmin (Step #) |
|---|---|---|---|
|                | 350 nm | 390 mn | 470 nm |
| Cyasorb UV-24 | 1 | 5 | 6 |

As can be seen from the data, addition of the absorber decreases the photographic speed at 350 nm in each case and at 390 nm in most cases. Differences in speed among absorbers are due to differences in molecular weight, extinction coefficient, and the shape of the absorption curve.

EXAMPLE 2

Capsules (B-1) were produced as outlined above which contained the following internal phase:

| TMPTA | 200 g |
|---|---|
| Quanticure ITX (Ward-Blenkinsop, Ltd.) | 2.0 g |
| Quanticure EPD (Ward-Blenkinsop, Ltd.) | 8.0 g |
| Experimental Cyan Precursor (Hilton-Davis) | 24 g |
| Givsorb UV-2 | 6 g |

A second capsule batch (B-2) was produced as above, but no Givsorb UV-2 was added. Both capsule batches were coated as in Example 1. With the exposure device described in Example 1, a series of stepwedge (64 sec.) exposures (20 nm bandpass) were made at 10 nm intervals to give the spectral sensitivity curves shown in FIG. 3. As can be seen by an examination of FIG. 3, the spectral sensitivity curve for ITX is appreciably sharpened by addition of the UV absorber. This allows the use of an initiator which absorbs maximally at 350 nm in the three-color system. At 350 nm, the capsule batch containing the absorber requires about 2.83 (three steps) times more light than the capsule batch without absorber to effect the same photographic response.

EXAMPLE 3

Capsules (C-1) were produced as outlined above which contained the following internal phase:

| TMPTA | 200 g |
|---|---|
| 7-diethylamino-3-cinnamoylcoumarin | 0.4 g |
| Quanticure EPD | 8 g |
| Reakt Yellow | 20 g |
| Tinuvin 326 (2-(3'-tert-butyl-5'methyl-2'-hydroxyphenyl)-5-chlorobenzotriazole) | 6 g |

A second capsule batch (C-2) was produced as above, but no Tinuvin 326 was added. Both capsules types were coated as in Example 1. A series of stepwedge exposures (20 nm bandwidth, 64 seconds) was made at 10 nm intervals to obtain the spectral sensitivity curves shown in FIG. 4.

As can be seen, addition of the absorber lowered the sensitivity of the system at shorter wavelengths, thus decreasing the spectral overlap in the three-color system shown in FIG. 2. At 390 nm, for example, the system is slowed by two stops (a factor of four) by addition of the UV absorber.

EXAMPLE 4

A photopolymerizable, microencapsulated, full-color, imaging system involving three types of microcapsules each containing a different dye precursor and sensitive at one of three wavelengths was prepared. Capsules A' are sensitive at 350 nm and contain a magenta precursor; Capsules B' are sensitive at 390 nm and contain a cyan precursor; and Capsules C' are sensitive at 470 nm and contain a yellow precursor.

Capsules A', B', and C' were prepared using the above procedure and the following internal phases. The internal phases were prepared by adding the monomer, photoinitiator, and color former to a 400 ml beaker, heating to 100° C. and stirring until all three had dissolved. Thereafter the isocyanate was added and emulsified.

| Internal Phases | |
|---|---|
| (i) Capsule A' | |
| 200 g | TMPTA (Trimethylolpropane Triacrylate from Sartomer) |
| 24 g | Quanticure BMS (4-Benzoyl-4'-Methyldiphenyl Sulphide from Ward-Blenkinsop) |
| 8 g | Quanticure EPD (Ethyl-4-Dimethylaminobenzoate from Ward-Blenkinsop) |
| 48 g | Copikem XX (from Hilton-Davis - purified) by silica gel column chromotography to remove inhibiting impurties |
| 6 g | SF-50 (Union Carbide Isocyanate) |
| 12 g | N-100 (Polyisocyanate Resin from Desmodur) |
| (ii) Capsule B' | |
| 200 g | TMPTA |
| 4 g | Quanticure ITX (2-Isopropylthioxanthone from Ward-Blenkinsop) |
| 8 g | Quanticure EPD |
| 24 g | Cyan S-29663 (from Hilton-Davis) |
| 6 g | Givsorb UV-2 (N—(p-Ethoxycarbonylphenyl)-N'—phenylformamidine from Givaudan) |
| 6 g | SF-50 |
| 12 g | N-100 |
| (iii) Capsule C' | |
| 200 g | TMPTA |
| 0.4 g | 3-Cinnamoyl-7-Diethylamino coumarin (U.S. Pat. No. 4,147,552) |
| 8 g | Quanticure EPD |
| 20 g | Reakt Yellow 186 (BASF) |
| 6 g | Tinuvin 326 (2-(3'-tert-Butyl-5'-Methyl-2'-hydroxyphenyl)-5-Chlorobenzotriazole from Ciba-Geigy) |
| 6 g | SF-50 |
| 12 g | N-100 |

Capsules A', B', and C' are mixed such that the combination of the three gives a neutral black when developed. The formulation used for coating is 113 g Capsule A', 150 g Capsule B' and 188 g Capsule C', 225 g 1% Triton X-100, 20 drops Triton X-100 and 120 g 5% Klucel L. The capsules and the Triton X-100 with water are mixed together and put in an ultrasonic bath for approximately 10 minutes to facilitate good mixing and break up any agglomerates that may have formed. The mixture is then filtered through 3-6 layers of cheesecloth. Finally, the Klucel L is stirred into the mixture and it is ready for coating.

The coating machine used is a Talboys Model #1217 coater. The above described formulation is coated on this machine using a #12 wire-wound Meyer bar on 8½ inch wide 80# Black and White Glossy basestock. This gives a capsule coatweight of 4-6 g/m². Light sensitive, full color, imaging paper is thus produced.

EXPOSURE AND DEVELOPMENT

The paper produced as described above is exposed with a Kratos Monochromatic Illumination System, Model MIS 1000 having a 1000 watt Xenon arc light source fitted with a GM 252 high intensity grating in which the converging lens has been removed. This modification gives an exposure field large enough to expose 8"×10" sheets at a distance of about 58 inches from the monochrometer. Color separation masks (Accucolor, Dayton, Ohio) are used in which a picture is taken through red, green, and blue filters and each is printed on a transparent base film. The green filter mask thus produced is placed over the light sensitive paper with proper registration. The monochrometer is set at 350 nm with a 20 nm bandwidth. The capsules are exposed through the mask for 15–30 seconds. The green filter mask is removed and the red filter mask is placed over the imaging sheet and registered. The monochrometer is set at 390 nm with a 20 nm bandwidth. The capsules are exposed for 20–30 seconds. This mask is then removed and replaced with the blue filter mask. Wavelength is set at 470 nm, again with a 20 nm bandwidth, and the capsules are exposed for 10–20 seconds. The exposed sheet is placed face down against a resin developer sheet prepared as set forth above. These two sheets are run together through a calendar stack with nip pressure of about 500 pli which breaks the unexposed or underexposed capsules, transfers the oil to the developer sheet, develops the dye, and forms a full color image. The speed of development can be enhanced by heating the sheet for about 30 seconds at 90° C.

SENSITIVITY

The spectral sensitivities of the capsules are graphed in FIG. 2. These curves were generated by exposing paper coated with one of the three capsule types through a 21 step photographic step table at each 10 nm increment through the wavelength range 300–500 nm on the monochrometer described above with a 20 nm bandwidth. The densities of each stepwedge image produced were read on a Macbeth densitometer and H and D curves were plotted at each wavelength measured with the aid of a computer program which takes into account the spectral output of the light source and the exposure time so that the curves plotted are in ergs/cm$^2$. The speeds at 90% density and at 10% density are calculated where 100% density of Dmax is unexposed and 0% density or Dmin is fully exposed. FIG. 2 plots the speeds at 10% density for capsules A′, B′, and C′. Capsule A′ has a 350 nm sensitivity of 300 ergs/cm$^2$ at 90% density and 800 ergs/cm$^2$ at 10% density. This capsule is exposed at 350 nm rather than 360 nm because capsule B′ is more sensitive at 360 nm than at 350 nm. Capsule B′ has a 390 nm sensitivity of 450 ergs/cm$^2$ at 90% density and 1100 ergs/cm$^2$ at 20% density. Capsule C′ has a 470 nm sensitivity of 550 ergs/cm$^2$ at 90% density and 2300 ergs/cm$^2$ at 10% density. The sensitivity of the photosensitive material is between about 800 and 2300 ergs/cm$^2$.

EXAMPLE 5

A microencapsulated full color imaging system was prepared and evaluated as in Example 4 except as noted below.

Capsules A″, B″ and C″ were prepared by following the encapsulation procedure set forth above using the following internal phase compositions:

Capsule A″
180 g    Photomer 4149 (from Diamond Shamrock)

-continued

| | |
|---|---|
| 16 g | Propylene Carbonate |
| 24 g | Quanticure BMS |
| 8 g | Quanticure EPD |
| 6 g | PIP$^+$PF$_6^-$ Diphenyliodonium Hexafluorophosphate prepared form Crivello, J.V.; Lam, J.H.W., J. Polym. Sci. Polym. Chem., 17 (1979), 977) |
| 48 g | Copikem XX (Hilton Davis) |
| 6 g | SF-50 |
| 12 g | N-100 |
| Capsule B″ | |
| 180 g | Photomer 4149 |
| 16 g | Propylene Carbonate |
| 4 g | Quanticure ITX |
| 8 g | Quanticure EPD |
| 6 g | PIP$^{30}$ PF$_6^-$ |
| 24 g | Experimental Cyan S-29663 |
| 6 g | Givsorb UV-2 |
| 6 g | SF-50 |
| 12 g | N-100 |
| Capsule C″ | |
| Same as C′ in Example 4. | |

The internal phase was prepared by dissolving the monomer, photoinitiator and color former as in Example 4; cooling the solution to room temperature and adding the propylene carbonate having the PIP$^+$PF$_6^-$ dissolved therein; adding the isocyanates, mixing thoroughly for two minutes, and emulsifying.

Figure 5:
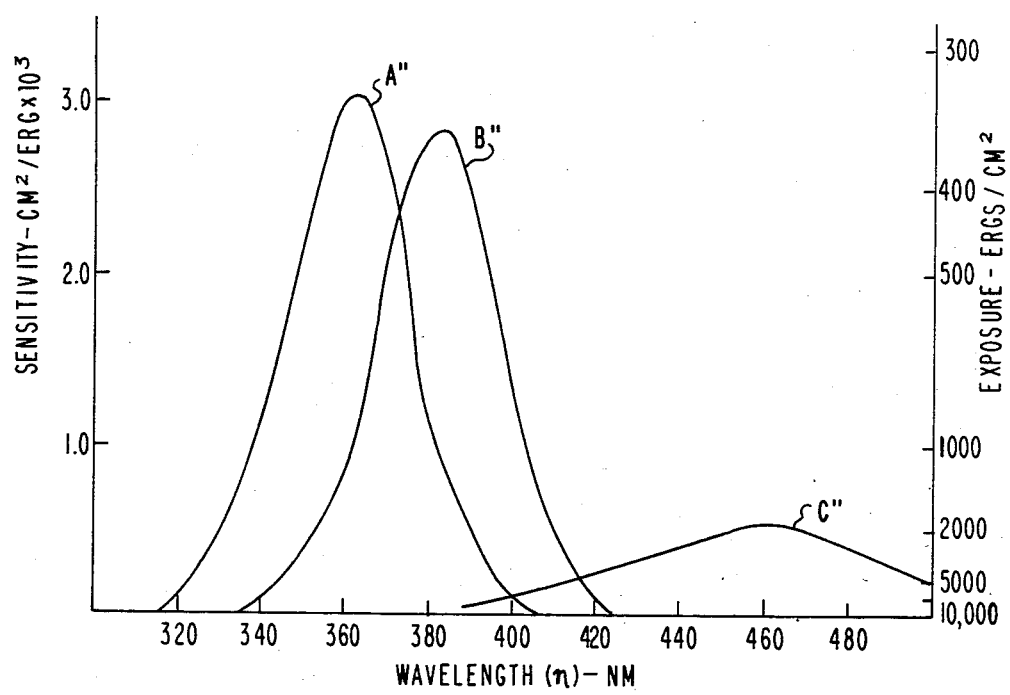
FIG. 5 is a graph of the spectral sensitivity curves of the microcapsules prepared in Example 5.

The capsules were mixed to give neutral black when developed and coated on a support as in Example 4. The spectral sensitivities of the capsules are plotted in FIG. 5. Capsule A″ has a 350 nm sensitivity of 200 ergs/cm$^2$ at 90% density and 500 ergs/cm$^2$ at 10% density. Capsule B″ has a 390 nm sensitivity of 180 ergs/cm$^2$ at 90% density and 380 ergs/cm$^2$ at 10% density. Capsule C″ has a 470 nm sensitivity of 550 ergs/cm$^2$ at 90% density and 2300 ergs/cm$^2$ at 10% density. Capsule C″ did not include the diphenyliodonium hexafluorophosphate, which would make the system faster. Had the capsules included the PIP$^+$PF$_6^-$, the speed at 470 nm would have been increased, but the speeds at 390 nm and 350 nm would also have been increased making color separation difficult. The sensitivity of the system, then, is between 380 and 2300 ergs/cm$^2$.

Having described the invention in detail and by reference to specific embodiments thereof, it will be apparent that numerous modifications and variations are possible without departing from the spirit and scope of the invention defined by the following claims.

What is claimed is:

1. A photosensitive material comprising a support having a layer of photosensitive microcapsules on the surface thereof,
    said photosensitive microcapsules including first and second photosensitive microcapsules having first and second color formers associated therewith and having internal phases which respectively contain first and second photosensitive compositions which harden upon exposure to actinic radiation;
    actinic radiation hardening said first photosensitive composition constituting a first spectral sensitivity range and actinic radiation hardening said second photosensitive composition constituting a second spectral sensitivity range;
    said first and second spectral sensitivity ranges being different but overlapping in part;
    said first photosensitive microcapsule additionally having associated therewith a compound which absorbs actinic radiation in the overlapping portion of said spectral sensitivity ranges such that the sensitivity of said first photosensitive microcapsule to actinic radiation in the overlapping portion of said spectral sensitivity ranges is reduced.

2. The photosensitive material of claim 1 wherein said microcapsules include discrete capsule walls.

3. The photosensitive material of claim 2 wherein said said compound which absorbs actinic radiation is present in the internal phase of said first photosensitive microcapsules with said first photosensitive composition.

4. The photosensitive material of claim 3 wherein said first photosensitive composition includes an ethylenically unsaturated compound and a photoinitiator.

5. The photosensitive material of claim 4 wherein said first and second associated color formers are present in said internal phases.

6. The photosensitive material of claim 5 wherein said absorber is further characterized in that said absorber does not substantially inhibit or promote free radical polymerization and said absorber possesses an extinction coefficient greater than 100/M cm.

7. The photosensitive material of claim 6 wherein said photosensitive microcapsules include a first set of microcapsules associated with a cyan color former and containing a first photohardenable composition, a second set of microcapsules associated with a magenta color former and containing a second photohardenable composition, and a third set of microcapsules associated with a yellow color former and containing a third photohardenable composition, one set of said first, second and third sets of microcapsules being said first photosensitive microcapsule and having associated therewith said compound which absorbs actinic radiation and reduces the sensitivity of said microcapsules to actinic radiation in said overlapping portion of said spectral sensitivity ranges and another set of said first, second and third sets of microcapsules being said second photosensitive microcapsules such that said first, second and third sets of microcapsules have sufficiently different sensitivity characteristics that said first photohardenable composition can be hardened upon exposure of said first microcapsules to actinic radiation of a first wavelength without substantially hardening the encapsulated second and third photohardenable compositions, said second photohardenable composition can be hardened upon exposure of said second microcapsules to actinic radiation of a second wavelength without substantially hardening said encapsulated first and third photohardenable compositions, and said third photohardenable composition can be hardened upon exposure of said third microcapsules to actinic radiation of a third wavelength without substantially hardening said encapsulated first and second photohardenable compositions.

8. The photosensitive material of claim 7 wherein at least one of said first, second and third sets of microcapsules is sensitive to ultraviolet radiation.

9. The photosensitive material of claim 7 wherein at least one of said first, second and third photohardenable compositions is sensitive to blue light.

10. The photosensitive material of claim 9 wherein said said compound which absorbs actinic radiation absorbs ultraviolet radiation.

11. The photosensitive material of claim 10 wherein said said compound which absorbs actinic radiation is selected from the group consisting of hydrobenzophenones, hydroxyphenylbenzotriazoles, and formamidines.

12. A process for imaging which comprises imagewise exposing a photosensitive material comprising a support having on the surface thereof a layer of photosensitive microcapsules, said photosensitive microcapsules including first and second photosensitive microcapsules having first and second color formers associated therewith and having internal phases which respectively contain first and second photosensitive compositions which harden upon exposure to actinic radiation, actinic radiation hardening said first photosensitive composition constituting a first spectral sensitivity range, and actinic radiation hardening said second photosensitive composition constituting a second spectral sensitivity range, said first and second spectral sensitivity ranges being different but overlapping in part, said first photosensitive microcapsule additionally having associated therewith a compound which absorbs actinic radiation in said overlapping portion of said spectral sensitivity ranges and thereby reduces the sensitivity of said first photosensitive microcapsule to actinic radiation in the overlapping portion of said first and second spectral sensitivity ranges;

subjecting said microcapsules to a force which causes said microcapsules to release said internal phase and thereby activate said color former; and contacting said released color former with a dry developer which reacts with said color former to form a color image.

* * * * *